United States Patent
Saito et al.

(10) Patent No.: US 10,054,640 B2
(45) Date of Patent: Aug. 21, 2018

(54) MOTOR DRIVING DEVICE INCLUDING DYNAMIC BRAKING CIRCUIT

(71) Applicant: FANUC CORPORATION, Yamanashi (JP)

(72) Inventors: Sou Saito, Yamanashi (JP); Tsutomu Shikagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 76 days.

(21) Appl. No.: 15/202,707

(22) Filed: Jul. 6, 2016

(65) Prior Publication Data

US 2017/0016958 A1 Jan. 19, 2017

(30) Foreign Application Priority Data

Jul. 14, 2015 (JP) .................. 2015-140821

(51) Int. Cl.
  *G01R 31/00* (2006.01)
  *G01R 31/327* (2006.01)
  *H02P 3/22* (2006.01)

(52) U.S. Cl.
  CPC ........... *G01R 31/3278* (2013.01); *H02P 3/22* (2013.01)

(58) Field of Classification Search
  CPC .............................. G01R 31/3278; H02P 3/22
  USPC .......... 702/58; 318/376, 400.29, 703, 400.21
  See application file for complete search history.

(56) References Cited

U.S. PATENT DOCUMENTS

| 8,890,448 B2* | 11/2014 | Putkinen | B66B 5/02 318/371 |
|---|---|---|---|
| 2013/0082045 A1* | 4/2013 | Mazumdar | B60L 1/02 219/494 |
| 2014/0152201 A1* | 6/2014 | Shriver | B64C 13/50 318/376 |

FOREIGN PATENT DOCUMENTS

| CN | 1383491 A | 12/2002 |
|---|---|---|
| CN | 1198147 C | 4/2005 |
| CN | 101330225 A | 12/2008 |
| CN | 102207539 A | 10/2011 |
| CN | 102712442 A | 10/2012 |
| CN | 103782502 A | 5/2014 |
| CN | 104698373 A | 6/2015 |
| JP | H5266290 A | 10/1993 |

(Continued)

OTHER PUBLICATIONS

English Abstract for Japanese Publication No. 5-266290 A, published Oct. 15, 1993, 2 pgs.

(Continued)

*Primary Examiner* — Stephanie Bloss
(74) *Attorney, Agent, or Firm* — Fredrikson & Byron, P.A.

(57) ABSTRACT

A motor driving device includes, a DB current calculation unit which calculates a DB current flowing through a DB circuit, based on the motor rotational speed and intrinsic parameters for a motor and the DB circuit, a Joule heat calculation unit which calculates a Joule heat resulting from a DB current, based on the DB current, a storage unit which stores a table defining the relationship between the DB current at the start of DB and the Joule heat resulting from an arc generated in a relay depending on the DB current, an integration unit which integrates the Joule heat resulting from an arc at the start of DB, the Joule heat resulting from a DB current, or the sum of these Joule heats, every time DB (Continued)

is performed, and a comparison unit which outputs the comparison result between the resultant integration value and a predetermined reference value.

4 Claims, 3 Drawing Sheets

(56) References Cited

FOREIGN PATENT DOCUMENTS

| JP | 6178438 | A | 6/1994 |
|---|---|---|---|
| JP | H833195 | A | 2/1996 |
| JP | 2007245966 | A | 9/2007 |
| JP | 2009142122 | A | 6/2009 |
| JP | 2013179741 | A | 9/2013 |
| WO | 2013049302 | A2 | 4/2013 |
| WO | 2014091602 | A1 | 6/2014 |

OTHER PUBLICATIONS

English Abstract for Japanese Publication No. 8-33195 A, published Feb. 2, 1996, 2 pgs.
English Abstract for Japanese Publication No. 2013-179741 A, published Sep. 9, 2013, 1 pg.
English Abstract for Japanese Publication No. 2009-142122, A, published Jun. 25, 2009, 1 pg.
English English Abstract for Japanese Publication No. 2007-245966 A, published Sep. 27, 2007, 1 pg.
English Abstract for Japanese Publication No. 06-178438 A, published Jun. 24, 1994, 1 pg.
Untranslated Decision to Grant a Patent mailed by Japan Patent Office (JPO) for Application No. JP 2015-140821, dated Jul. 24, 2017, 3 pages.
English machine translation of Decision to Grant a Patent mailed by Japan Patent Office (JPO) for Application No. JP 2015-140821, dated Jul. 24, 2017, 3 pages.
English Abstract and Machine Translation for Chinese Publication No. 1383491 A, dated Dec. 4, 2002, 15 pgs.
English Abstract and Machine Translation for Chinese Publication No. 1198147 C, dated Apr. 20, 2005, 1 pg.
English Abstract and Machine Translation for Chinese Publication No. 101330225 A, dated Dec. 24, 2008, 7 pgs.
English Abstract and Machine Translation for Chinese Publication No. 102207539 A, dated Oct. 5, 2011, 6 pgs.
English Abstract and Machine Translation for Chinese Publication No. 102712442 A, published Oct. 3, 2012, 13 pgs.
English Abstract and Machine Translation for Chinese Publication No. 103782502 A, published May 7, 2014, 18 pgs.
English Abstract and Machine Translation for Chinese Publication No. 104698373 A, published Jun. 10, 2015, 7 pgs.

* cited by examiner

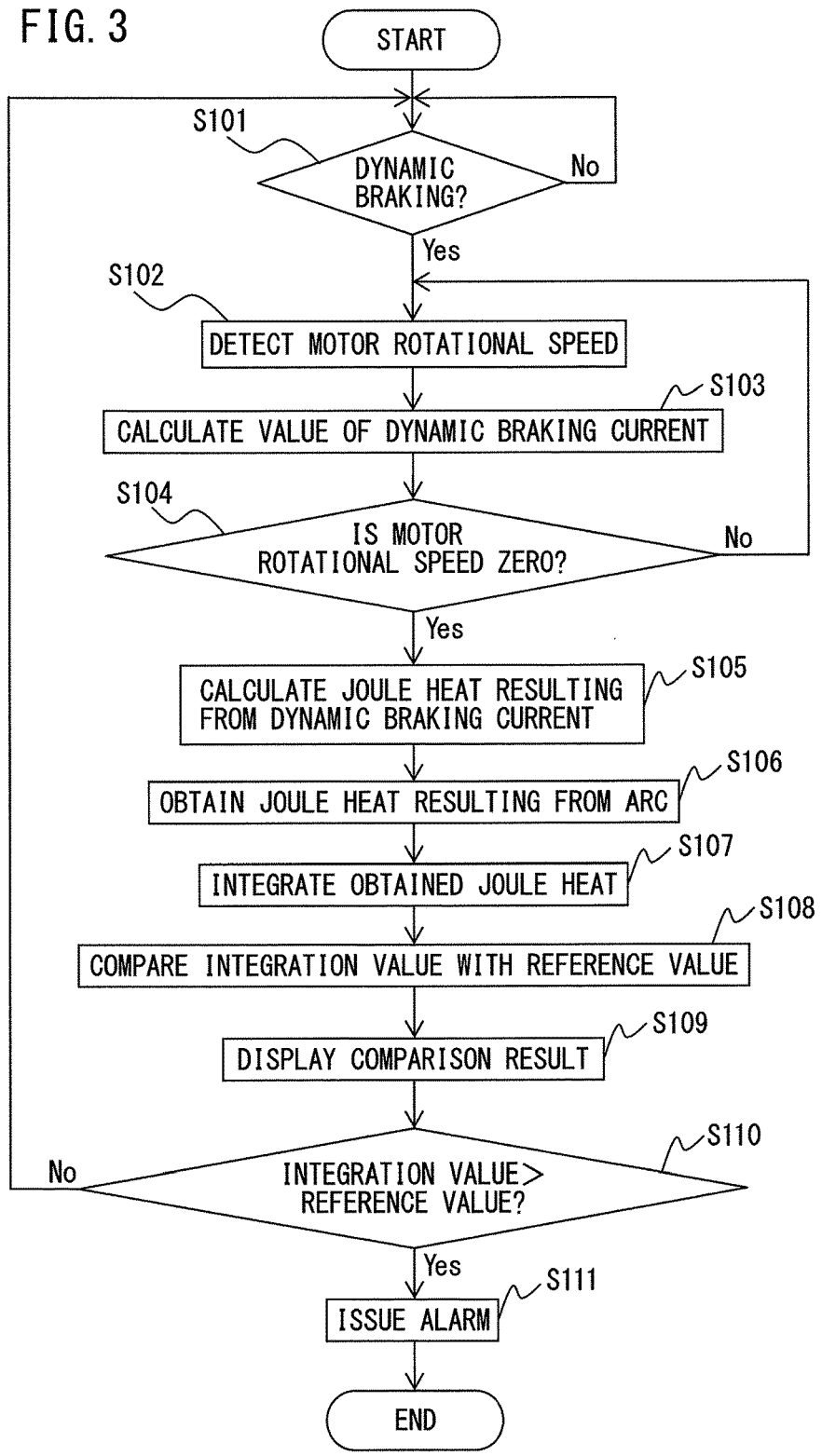

MOTOR DRIVING DEVICE INCLUDING DYNAMIC BRAKING CIRCUIT

BACKGROUND OF THE INVENTION

1. Field of the Invention

The present invention relates to a motor driving device including a dynamic braking circuit.

2. Description of the Related Art

A motor driving device widely uses a dynamic brake which causes a short circuit across the input terminals of a motor to perform dynamic braking, at the time of anomalies such as an emergency stop or the occurrence of an alarm.

A dynamic braking circuit typically includes a dynamic braking circuit relay (to be simply referred to as a "relay" hereinafter) located across the input terminals of a motor, and a dynamic braking resistor connected to the relay. In dynamic braking, the supply of driving power to the motor is cut off, and thereupon the relay is closed to cause a short circuit across the input terminals of the motor (i.e., between the phases of the motor windings). Since the motor maintains a magnetic field flux even after electrical isolation from the power supply and, while rotating by inertia, serves as an electric generator, the thus generated current flows into the dynamic braking resistor through the closed relay and produces a deceleration torque in the motor. In this manner, the dynamic braking circuit can rapidly convert the rotational energy of the motor into Joule heat by dynamic braking resistance (and motor winding resistance) to perform dynamic braking.

In general, the relay in the dynamic braking circuit includes contacts, the opening and closing life of which considerably depends on the voltage applied across the contacts upon contact opening and closing. When the relay shifts from an open to closed state, a phenomenon called chattering (or bouncing) in which the surfaces of two contacts forming the relay repeat contact and separation in steps has taken place for a predetermined time, and then the contacts finally, stably come into contact with each other and settle in a closed state. However, attempting to close the interval between the contacts while a high voltage is applied across the contacts of the relay causes a spark between the contacts due to arc discharge during the chattering. Such a spark welds the contacts of the relay together or wears them, thus shortening the life of the relay. To replace the relay at an appropriate timing as well, it is important to accurately predict the life of the relay.

As described in, e.g., Japanese Unexamined Patent Publication No. H5-266290, one technique for predicting the life of the relay compares with each other the result of life prediction calculation based on the voltage or current applied to the relay and the count result of the number of relay operations and displays the life.

As described in, e.g., Japanese Unexamined Patent Publication No. H8-033195, another technique detects the phase of current flowing through the dynamic braking circuit during the dynamic braking operation and its magnitude in this phase, calculates the capacity of the dynamic braking circuit per dynamic braking operation period, and determines that the dynamic braking circuit is abnormal when the dynamic braking current is higher than the maximum current or the capacity of the dynamic braking circuit is higher than the maximum capacity.

As described above, relay life prediction according to the conventional techniques may preferably use a current detection unit which detects a current flowing through the relay and entails certain costs, thus making it difficult to achieve a compact device. In particular, the motor driving device may be preferably provided with not only a current detection unit for motor driving but also a separate current detection unit for relay life prediction in the dynamic braking circuit. This accordingly increases the cost and may involve a large motor driving device.

Further, since the life of the relay shortens every time an arc is generated due to chattering between the contacts of the relay in the above-described manner, the life predicted with no concern for damage inflicted by the arc is inaccurate.

SUMMARY OF INVENTION

In view of the above problems, an object of the present invention is to provide a compact, low-cost motor driving device which can accurately predict the life of a relay in a dynamic braking circuit.

In order to achieve the above object, the present invention provides a motor driving device including a dynamic braking circuit which closes a relay located across the input terminals of a motor to cause a resistive short circuit across the input terminals to generate a deceleration torque in the motor includes, a dynamic braking current calculation unit which calculates the value of dynamic braking current flowing through the dynamic braking circuit, based on the motor rotational speed and a parameter predefined for the motor and the dynamic braking circuit, a Joule heat calculation unit calculates a Joule heat resulting from a dynamic braking current supplied to a contact of the relay in the dynamic braking period, based on the value of dynamic braking current obtained by the dynamic braking current calculation unit, a storage unit stores in advance a table defining the relationship between the value of dynamic braking current at the start of dynamic braking and the Joule heat resulting from an arc generated in the vicinity of the contact of the relay depending on the value of dynamic braking current at the start of dynamic braking, an integration unit integrates the Joule heat resulting from an arc and obtained from the table as a Joule heat corresponding to the value of dynamic braking current obtained by the dynamic braking current calculation unit at the start of dynamic braking, the Joule heat resulting from a dynamic braking current and obtained by the Joule heat calculation unit in the dynamic braking period, or the sum of the Joule heat resulting from the arc and the Joule heat resulting from the dynamic braking current, every time dynamic braking is performed, and a comparison unit compares an integration value obtained by the integration unit with a preset reference value and outputs a comparison result.

The motor driving device may further include an alarm unit which issues an alarm when the comparison result reveals that the integration value has exceeded the reference value.

The motor driving device may further include a display unit which displays the comparison result.

The table may define not only the relationship between the value of dynamic braking current at the start of dynamic braking and the Joule heat resulting from the arc, but also the relationship between the Joule heat resulting from the arc and information representing at least one of the voltage across the input terminals of the motor, the humidity in the vicinity of the motor, the atmospheric pressure in the vicinity of the motor, and the temperature in the vicinity of the motor at the start of dynamic braking. The Joule heat resulting from the arc may be obtained based on the information and the value of dynamic braking current at the start of dynamic braking, defined in the table, every time dynamic braking is performed.

BRIEF DESCRIPTION OF THE DRAWINGS

The present invention will be more clearly understood by referring to the accompanying drawings:

FIG. 3 is a flowchart illustrating the operation sequence of the motor driving device according to the embodiment.

DETAILED DESCRIPTION

A motor driving device including a dynamic braking circuit will be described below with reference to the drawings. However, it should be understood that the present invention is not to be limited to the drawings or the embodiments described below.

Figure 1:
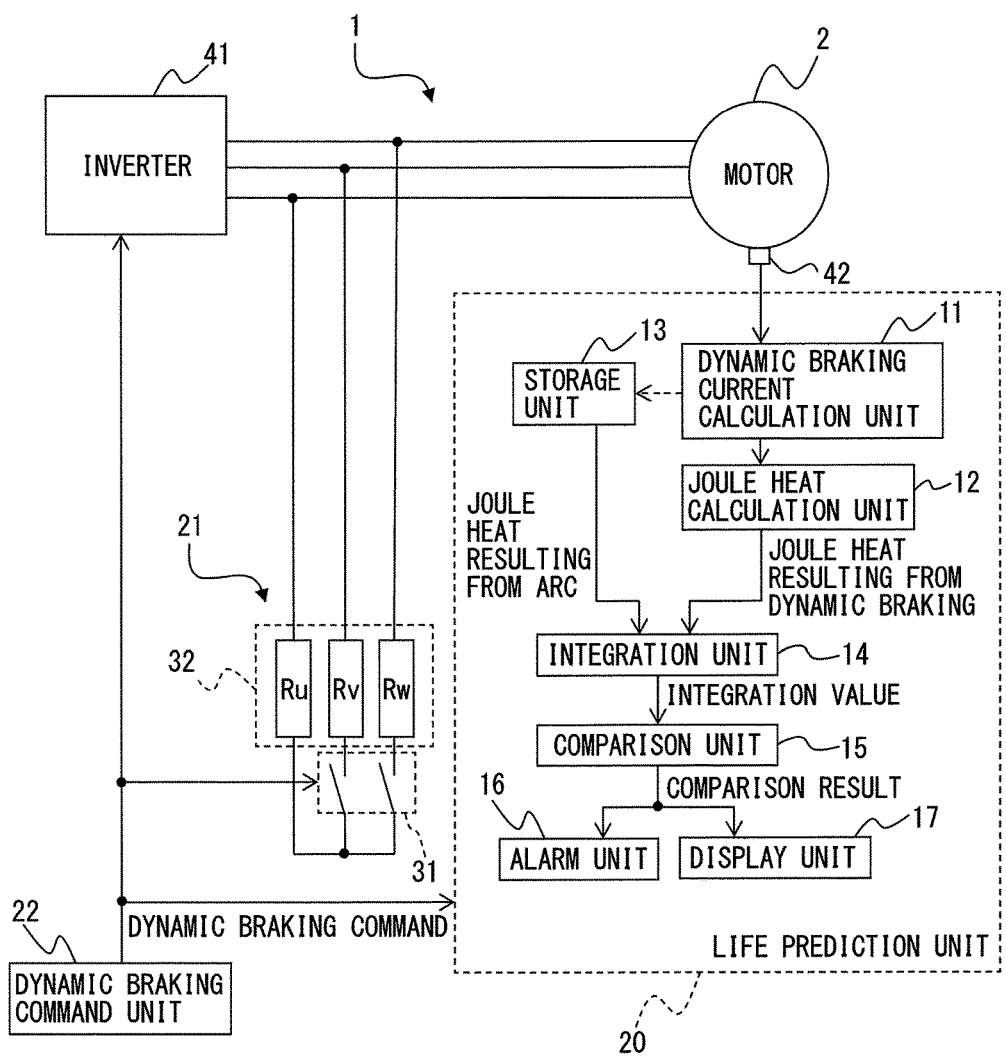
FIG. 1 is a principle block diagram illustrating a motor driving device according to an embodiment.

FIG. 1 is a principle block diagram illustrating a motor driving device according to an embodiment. A motor driving device 1 which controls driving of only one three-phase AC motor 2 will be described herein. However, the number of motors 2 controlled in driving by the motor driving device 1 does not particularly limit the present invention, and a plurality of motors 2 may be used. When a plurality of motors 2 are used, a plurality of dynamic braking circuits 21 are provided in correspondence with the motors 2 and a life prediction unit 20 (to be described later) is also provided for each dynamic braking circuit 21.

The motor driving device 1 includes an inverter 41, a dynamic braking circuit 21, a dynamic braking command unit 22, and a life prediction unit 20.

The inverter 41 converts a DC current supplied from the DC input side (not illustrated) into an AC current for driving the motor 2. The AC current output from the inverter 41 is supplied to the motor 2 via the input terminals of the motor 2 to rotate the motor 2. The DC input side of the inverter 41 is typically provided with a converter (not illustrated) which converts an AC current supplied from a commercial AC power supply into a DC current and outputs the DC current. For the sake of descriptive simplicity, FIG. 1 illustrates no control system for causing the inverter 41 to output an AC current for driving the motor 2.

The dynamic braking circuit 21 includes a dynamic braking circuit relay (to be simply referred to as a "relay" hereinafter) 31 located across the input terminals of the motor 2 (i.e., between the phases of the motor windings), and a dynamic braking resistor 32 connected to the relay 31. In dynamic braking, the dynamic braking command unit 22 instructs the inverter 41 not to supply driving power to the motor 2 and the dynamic braking circuit 21 to close the relay 31, as a dynamic braking command. In accordance with the dynamic braking command, the inverter 41 cuts off the supply of driving power to the motor 2 and the dynamic braking circuit 21 closes the relay 31 to cause a short circuit across the input terminals of the motor 2. Since the motor 2 maintains a magnetic field flux even after electrical isolation from the power supply and, while rotating by inertia, serves as an electric generator, the thus generated current flows into the dynamic braking resistor 32 through the closed relay 31 and produces a deceleration torque in the motor 2.

The life prediction unit 20 performs life prediction processing in response to the dynamic braking command from the dynamic braking command unit 22. The life prediction unit 20 includes a dynamic braking current calculation unit 11, a Joule heat calculation unit 12, a storage unit 13 which stores a table, an integration unit 14, and a comparison unit 15. The life prediction unit 20 further includes an alarm unit 16 and a display unit 17, but no display unit 17 may be used.

The dynamic braking current calculation unit 11 calculates the value of dynamic braking current flowing through the dynamic braking circuit 21 in the dynamic braking period, based on the motor rotational speed detected by a rotation sensor 42, and parameters predefined for the motor 2 and the dynamic braking circuit 21. The value of dynamic braking current obtained by the dynamic braking current calculation unit 11 is calculated for each obtaining period $\Delta t$ over the dynamic braking period. Therefore, the rotation sensor 42 detects the motor rotational speed for each obtaining period $\Delta t$.

Figure 2:
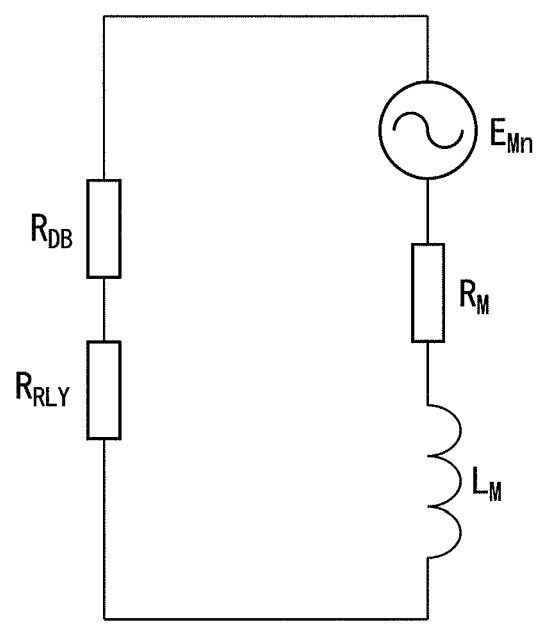
FIG. 2 is a circuit diagram illustrating a dynamic braking circuit and an equivalent circuit corresponding to one phase of a motor in the dynamic braking period.

Calculation processing by the dynamic braking current calculation unit 11 will be described herein with reference to FIG. 2 and Table 1. FIG. 2 is a circuit diagram illustrating a dynamic braking circuit and an equivalent circuit corresponding to one phase of a motor in the dynamic braking period. Table 1 represents parameters used for calculation processing by the dynamic braking current calculation unit 11.

TABLE 1

Parameters Used for Calculation of Dynamic Braking Current

| Symbol | Name | Note |
|---|---|---|
| n | Number of Times Motor Rotational Speed Is Obtained After Start of Dynamic Braking | Calculated Value |
| $\Delta t$ | Obtaining Period | Fixed Value |
| $N_n$ | Rotational Speed for nth Obtaining Operation | Measured Value |
| $\omega_n$ | Rotation Angle Frequency for nth Obtaining Operation | Calculated Value |
| $I_{DBn}$ | Dynamic Braking Current for nth Obtaining Operation | Calculated Value |
| $I_{Pn}$ | Peak Value of Dynamic Braking Current for nth Obtaining Operation | Calculated Value |
| $\theta_n$ | Electrical Angle Phase for nth Obtaining Operation | Calculated Value |
| $K_v$ | Motor Back Electromotive Force Constant | Fixed Value |
| $P_M$ | Motor Pole Number | Fixed Value |
| $L_M$ | Motor Winding Inductance | Fixed Value |
| $R_M$ | Motor Winding Resistance | Fixed Value |
| $R_{DB}$ | Dynamic Braking Resistance | Fixed Value |
| $R_{RLY}$ | Relay Contact Resistance | Fixed Value |
| $J_I$ | Joule Heat Resulting from Dynamic Braking Current | Calculated Value |

In the dynamic braking period, the rotation sensor 42 obtains the motor rotational speed for each obtaining period $\Delta t$. Letting $R_{RLY}$ be the contact resistance of the relay 31, $R_{DB}$ be the dynamic braking resistance, $R_M$ be the winding resistance of the motor 2, $L_M$ be the winding inductance of the motor 2, and $E_{Mn}$ be the back electromotive force generated in the motor 2 for the nth obtaining operation, a single-phase circuit network including the dynamic braking circuit 21 and the motor 2 for the nth obtaining operation (n: natural number) is represented as a series circuit as illustrated as FIG. 2.

Then, letting $P_M$ be the pole number of the motor 2, $\Delta t$ be the obtaining period, and $\theta_i$ be the electrical angle phase of the motor 2 for the i-th obtaining operation, the electrical angle phase $\theta_n$ of the motor 2 for the nth obtaining operation is given by:

$$\theta_n = \frac{P_M}{2} \Delta t \sum_{i=0}^{n} \omega_i \quad (1)$$

Using equation (1), the back electromotive force $E_{Mn}$ generated in the motor 2 for the nth obtaining operation is given by:

$$E_{Mn} = K_v \omega_n \sin \theta_n \quad (2)$$

where $K_v$ is a motor back electromotive force constant and $\omega_n$ is the rotation angle frequency of the motor 2 for the nth obtaining operation.

Circuit equations for the equivalent circuit illustrated as FIG. 2 are given by:

$$E_{Mn} = R I_{DBn} + L_M \frac{d I_{DBn}}{dt} \quad (3)$$

$$R = R_M + R_{DB} + R_{RLY} \quad (4)$$

A general solution to the value of dynamic braking current $I_{DBn}$ for the nth obtaining operation in equation (3) can be expressed as:

$$I_{DBn} = A \sin \theta_n + B \cos \theta_n + C e^{-\frac{R}{L_M} t} \quad (5)$$

where A, B, and C are coefficients.

Since the value of dynamic braking current $I_{DBn}$ for the nth obtaining operation is described by a periodic function, C=0 holds in equation (5). The coefficients A and B are solved by substituting equations (1) through (4) for equation (5) to yield:

$$I_{DBn} = \frac{Kv}{\sqrt{\left(\frac{R}{\omega_n}\right)^2 + \left(\frac{P_M L_M}{2}\right)^2}} \cos(\theta_n - \theta_{an}) \quad (6)$$

$$\theta_{an} = \tan^{-1} \frac{R}{\frac{P_M}{2} \omega_n L_M} \quad (7)$$

where $\theta_{an}$ in equation (7) is the shift in phase for the nth obtaining operation, i.e., the shift only in waveform and is, therefore, negligible.

Hence, the value of dynamic braking current $I_{DBn}$ for the nth obtaining operation is given by:

$$I_{DBn} = I_{Pn} \cos \theta_n \quad (8)$$

$$I_{Pn} = \frac{K_V}{\sqrt{\left(\frac{R}{\omega_n}\right)^2 + \left(\frac{P_M L_M}{2}\right)^2}}$$

$$\theta_n = \frac{P_M}{2} \Delta t \sum_{i=0}^{n} \omega_i$$

$$\omega_n = N_n \times \frac{2\pi}{60}$$

where $I_{pn}$ is the peak value (amplitude) of the value of dynamic braking current $I_{DBn}$, and $N_n$ is the motor rotational speed for the nth obtaining operation detected by the rotation sensor 42.

As described above, the dynamic braking current calculation unit 11 calculates the value of dynamic braking current $I_{DBn}$ (corresponding to one phase) flowing through the dynamic braking circuit 21, for each obtaining period $\Delta t$ over the dynamic braking period, based on the motor rotational speed $N_n$ detected by the rotation sensor 42, and the above-mentioned parameters (i.e., the contact resistance $R_{RLY}$ of the relay 31, the dynamic braking resistance $R_{DB}$, the winding resistance $R_M$ of the motor 2, the winding inductance $L_M$ of the motor 2, and the motor back electromotive force constant $K_v$) predefined for the motor 2 and the dynamic braking circuit 21.

Referring back to FIG. 1, the Joule heat calculation unit 12 calculates a Joule heat $J_I$ resulting from a dynamic braking current supplied to the contacts of the relay 31 in the dynamic braking period, based on the value of dynamic braking current $I_{DBn}$ obtained by the dynamic braking current calculation unit 11. The dynamic braking current continues to flow in the dynamic braking period and generates the Joule heat $J_I$ given by:

$$J_I = \sum_{n=0}^{n_{end}} (I_{DBn}^2 \times R_{RLY} \times \Delta t) \quad (9)$$

where $n_{end}$ is the number of times a dynamic braking current is obtained the moment the motor rotational speed $N_n$ becomes zero, which is defined because dynamic braking started by the dynamic braking circuit 21 ends when the motor rotational speed $N_n$ becomes zero.

Hence, the Joule heat calculation unit 12 calculates a Joule heat $J_I$ resulting from a dynamic braking current supplied to the contacts of the relay 31 in the dynamic braking period, in accordance with equation (9) based on the value of dynamic braking current $I_{DBn}$ calculated by the dynamic braking current calculation unit 11 in accordance with equation (8).

The storage unit 13 stores a table defining the relationship between the value of dynamic braking current at the start of dynamic braking and the Joule heat $J_A$ resulting from an arc generated in the vicinity of the contacts of the relay 31 depending on the value of dynamic braking current at the start of dynamic braking. The table stored in the storage unit 13 is looked up to obtain an amount of heat corresponding to the value of dynamic braking current obtained by the dynamic braking current calculation unit 11 at the start of dynamic braking. This table is created based on an experiment before the actual operation of the motor driving device 1. In other words, before the actual operation of the motor driving device 1, an experiment is conducted in which the relay 31 as supplied with currents having various magnitudes is opened and closed and the amount of heat generated in the vicinity of the contacts of the relay 31 at each time is measured using a calorimeter, and the relationship between the current and the amount of heat obtained by the experiment is compiled into a database and stored in the storage unit 13 as a table. The relay 31 as supplied with a current is opened and closed and the amount of heat generated at this time is measured in the experiment, and the relationship between the current and the amount of heat at this time is adopted as "the relationship between the value of dynamic braking current at the start of dynamic braking and the Joule heat resulting from an arc generated in the vicinity of the contacts of the relay 31 at the start of dynamic braking." This is done because the Joule heat $J_A$ is generated due to an arc in the dynamic braking circuit 21 when the relay 31 is closed. The obtained table is stored in the storage unit 13 in advance before the actual operation of the motor driving device 1. Table 2 illustrates an exemplary table representing the relationship between the value of dynamic braking current $I_{DB0}$ at the start of dynamic braking and the Joule heat $J_A$ resulting from an arc.

TABLE 2

Relationship between Dynamic Braking Current at Start of Dynamic Braking and Joule Heat Resulting from Arc

| Value of Dynamic Braking Current $I_{DB0}$ at Start of Dynamic Braking | Joule Heat $J_A$ Resulting from Arc |
|---|---|
| 10 [A] | 10 [J] |
| 20 [A] | 40 [J] |
| ... | ... |
| ... | ... |

The Joule heat $J_A$ resulting from an arc generated upon closing of the relay 31 at the start of dynamic braking is obtained by reading out from the table stored in the storage unit 13, an amount of heat corresponding to the value of dynamic braking current obtained by the dynamic braking current calculation unit 11 at the start of dynamic braking.

Referring back to FIG. 1, the integration unit 14 integrates the sum of the Joule heat $J_A$ resulting from an arc and obtained from the table stored in the storage unit 13 as an amount of heat corresponding to the value of dynamic braking current obtained by the dynamic braking current calculation unit 11 at the start of dynamic braking, and the Joule heat $J_I$ resulting from a dynamic braking current and obtained by the Joule heat calculation unit 12 in the dynamic braking period, every time the dynamic braking circuit 21 performs dynamic braking. The sum $J_{sum}$ is given by:

$$J_{sum} = J_I + J_A \quad (10)$$

Hence, the integration value $J_{int}$ obtained by integration processing by the integration unit 14 is given by:

$$J_{int} = \sum_{k=0}^{n_{end}} J_{sum} \quad (11)$$

The integration unit 14 executes integration processing every time the dynamic braking circuit 21 performs dynamic braking. In this case, the integration unit 14 integrates the sum $J_{sum}$ of the Joule heat $J_A$ resulting from an arc and the Joule heat $J_I$ resulting from a dynamic braking current to obtain an integration value $J_{int}$. However, as a modification to this embodiment, an integration value $J_{int}$ may be obtained by integrating only the Joule heat $J_A$ resulting from an arc or only the Joule heat $J_I$ resulting from a dynamic braking current.

Referring back to FIG. 1, the comparison unit 15 compares the integration value $J_{int}$ obtained by the integration unit 14 with a preset reference value $J_{ref}$ and outputs a comparison result. As the reference value $J_{ref}$, the upper limit of the amount of integrated heat that allows the relay 31 to exhibit its intrinsic performance is preferably set and, for example, may be preferably set with reference to the heat durability specified in, e.g., a specification table for the relay 31 as an indication of the life of the relay 31.

The alarm unit 16 and the display unit 17 are notified of the comparison result output from the comparison unit 15.

When the comparison result obtained by comparison processing by the comparison unit 15 reveals that the integration value $J_{int}$ obtained by the integration unit 14 has exceeded the reference value $J_{ref}$, the alarm unit 16 issues an alarm indicating that the relay 31 has come to the end of its life. Examples of the alarm unit 16 may include a loudspeaker, a buzzer, and a device which generates a sound such as a chime, a device which emits light such as a light, and a display screen which displays a text or an image.

The display unit 17 displays the comparison result obtained by the comparison unit 15. The comparison result may be displayed on the display unit 17 not only when the integration value $J_{int}$ obtained by the integration unit 14 exceeds the reference value $J_{ref}$ but also when the integration value $J_{int}$ falls below the reference value $J_{ref}$. The display unit 17 may be implemented in, e.g., a display screen for a console panel mounted in the motor driving device 1, or a display screen for a portable terminal or a personal computer. Without the display unit 17, only the alarm unit 16 may be used to issue an alarm when the comparison result reveals that the integration value $J_{int}$ obtained by the integration unit 14 has exceeded the reference value $J_{ref}$.

The operation of the motor driving device according to the embodiment will be described below. FIG. 3 is a flowchart illustrating the operation sequence of the motor driving device according to the embodiment.

When the motor driving device 1 controls driving of the motor 2, the life prediction unit 20 determines in step S101 whether the dynamic braking circuit 21 has started its dynamic braking operation. In dynamic braking, the dynamic braking command unit 22 instructs the inverter 41 not to supply driving power to the motor 2 and the dynamic braking circuit 21 to close the relay 31, as a dynamic braking command. Therefore, upon receiving the dynamic braking command, the life prediction unit 20 can determine that the dynamic braking circuit 21 has started its dynamic braking operation. When it is determined in step S101 that the dynamic braking circuit 21 has started its dynamic braking operation, the process advances to step S102.

In step S102, the rotation sensor 42 detects the rotational speed of the motor 2.

In step S103, the dynamic braking current calculation unit 11 calculates the value of dynamic braking current $I_{DBn}$ flowing through the dynamic braking circuit 21, in accordance with equation (8) based on the motor rotational speed $N_n$ detected by the rotation sensor 42, and parameters (i.e., the contact resistance $R_{RLY}$ of the relay 31, the dynamic braking resistance $R_{DB}$, the winding resistance $R_M$ of the motor 2, the winding inductance $L_M$ of the motor 2, and the motor back electromotive force constant $K_v$) predefined for the motor 2 and the dynamic braking circuit 21. The obtained value of dynamic braking current $I_{DBn}$ is stored in a memory (not illustrated).

In step S104, the life prediction unit 20 determines whether the motor rotational speed $N_n$ detected by the rotation sensor 42 is zero. When the motor rotational speed $N_n$ is not zero, the process returns to step S102. The detection processing of the motor rotational speed $N_n$ by the rotation sensor 42 in step S102, the calculation processing of the value of dynamic braking current $I_{DBn}$ by the dynamic braking current calculation unit 11 in step S103, and the determination processing of the motor rotational speed $N_n$ by the life prediction unit 20 in step S104 are repeated until the motor rotational speed $N_n$ becomes zero. "The values of dynamic braking current $I_{DBn}$ for the nth obtaining operation" are sequentially stored in the memory. With this operation, the value of dynamic braking current $I_{DBn}$ flowing through the dynamic braking circuit 21 is obtained as discrete data over the "dynamic braking period" from the start of dynamic braking to the end of dynamic braking (i.e., the time when the motor rotational speed $N_n$ becomes zero).

When the motor rotational speed $N_n$ becomes zero, in step S105 the Joule heat calculation unit 12 calculates a Joule heat $J_I$ resulting from a dynamic braking current supplied to the contacts of the relay 31 in the dynamic braking period, in accordance with equation (9) based on the value of dynamic braking current $I_{DBn}$ calculated by the dynamic braking current calculation unit 11 in accordance with equation (8).

In step S106, the integration unit 14 reads out from the table stored in the storage unit 13, an amount of heat corresponding to the value of dynamic braking current obtained by the dynamic braking current calculation unit 11 at the start of dynamic braking (i.e., the value of dynamic braking current $I_{DB1}$ obtained in the first operation), and obtains the readout amount of heat as "the Joule heat $J_A$ resulting from an arc generated upon closing of the relay 31 at the start of dynamic braking."

In step S107, the integration unit 14 further adds the sum $J_{sum}$ of the Joule heat $J_A$ resulting from an arc and obtained from the table stored in the storage unit 13 and the Joule heat $J_I$ resulting from a dynamic braking current and obtained by the Joule heat calculation unit 12 to the already obtained integration value. Since the processes in steps S101 to S110 are repeated until the integration value $J_{int}$ exceeds the reference value $J_{ref}$ in step S110 (to be described later), the sum $J_{sum}$ of the Joule heat $J_A$ resulting from an arc and the Joule heat $J_I$ resulting from a dynamic braking current, obtained every time the dynamic braking circuit 21 performs dynamic braking, is sequentially integrated.

In step S108, the comparison unit 15 compares the integration value $J_{int}$ obtained by the integration unit 14 in step S107 with a preset reference value $J_{ref}$ and outputs a comparison result. The obtained comparison result is displayed on the display unit 17 in step S109. The process in step S109 is omitted when no display unit 17 is used.

When it is determined as a result of comparison processing by the comparison unit 15 in step S108 that the integration value $J_{int}$ obtained by the integration unit 14 falls below the reference value $J_{ref}$ (No in step S110), the process returns to step S101, in which the dynamic braking circuit 21 stands by for the next dynamic braking operation. Until the integration value $J_{int}$ obtained by the integration unit 14 exceeds the reference value $J_{ref}$, steps S101 to S110 are repeated every time a dynamic braking operation is performed to sequentially integrate the sum $J_{sum}$ of the Joule heat $J_A$ resulting from an arc and the Joule heat $J_I$ resulting from a dynamic braking current, obtained every time the dynamic braking circuit 21 performs dynamic braking. When the comparison result reveals that the integration value $J_{int}$ obtained by the integration unit 14 has exceeded the reference value $J_{ref}$ (Yes in step S110), in step S111 the alarm unit 16 issues an alarm indicating that the relay 31 has come to the end of its life. With this operation, the operator can determine that the relay 31 in the dynamic braking circuit 21 has come to the end of its life.

When the relay 31 in the dynamic braking circuit 21 is closed in the above-mentioned manner, an arc is generated due to chattering between the contacts, so the life of the relay 31 gradually shortens. According to the present invention, however, since the above-described processes in steps S101 to S111 are executed to issue an alarm in consideration of damage inflicted on the relay 31 by the arc, the life of the relay 31 in the dynamic braking circuit 21 can be predicted accurately. Further, the value of dynamic braking current $I_{DBn}$ flowing through the dynamic braking circuit 21 is obtained not through detection by a current detection unit but through calculation by the dynamic braking current calculation unit 11. This involves no current detection unit for predicting the life of the relay 31 in the dynamic braking circuit 21, thus downsizing the motor driving device 1 at a low cost.

In the above-described embodiment, a table defining the relationship between the value of dynamic braking current at the start of dynamic braking and the Joule heat $J_A$ resulting from an arc generated in the vicinity of the contacts of the relay 31 depending on the value of dynamic braking current at the start of dynamic braking is used as the table stored in the storage unit 13. As a modification to this embodiment, a table defining not only the relationship between the value of dynamic braking current at the start of dynamic braking and the Joule heat $J_A$ resulting from an arc, but also the relationship between the Joule heat $J_A$ resulting from an arc and information representing at least one of the voltage across the input terminals of the motor 2 (i.e., across the phases of the motor winding), the humidity in the vicinity of the motor 2, the atmospheric pressure in the vicinity of the motor 2, and the temperature in the vicinity of the motor 2 at the start of dynamic braking may be used. This table is created based on an experiment before the actual operation of the motor driving device 1. In other words, before the actual operation of the motor driving device 1, an experiment is conducted in which the relay 31, as supplied with currents having various magnitudes upon various changes in condition such as the voltage across the input terminals of the motor 2, the humidity, atmospheric pressure, and temperature in the vicinity of the motor 2, is opened and closed and the amount of heat generated in the vicinity of the contacts of the relay 31 at each time is measured using a calorimeter, and the relationship between each piece of information and the amount of heat obtained by the experiment is compiled into a database and stored in the storage unit 13 as a table in advance before the motor driving device 1 starts its actual operation. Table 3 illustrates an exemplary table representing the relationship between each piece of information including the value of dynamic braking current $I_{DB0}$ at the start of dynamic braking and the Joule heat $J_A$ resulting from an arc. Although Table 3 represents the voltage across the input terminals of the motor 2 and the humidity, atmospheric pressure, and temperature in the vicinity of the motor 2, not all of these types of information may be defined in the table. It suffices to selectively define these types of information as appropriate in accordance with the environment under which the motor driving device 1 is driven, or additionally define another type of information.

TABLE 3

Relationship between Each Type of Information and Joule Heat Resulting from Arc

| Value of Dynamic Braking Current $I_{DB0}$ at Start of Dynamic Braking | Voltage | Humidity | Temperature | Atmospheric Pressure | Joule Heat $J_A$ Resulting from Arc |
|---|---|---|---|---|---|
| 10 [A] | 100 [V] | 40% | 20 [° C.] | 1000 [hPa] | 10 [J] |
| 10 [A] | 100 [V] | 40% | 20 [° C.] | 1050 [hPa] | 11 [J] |
| ... | ... | ... | ... | ... | ... |
| ... | ... | ... | ... | ... | ... |

In this case, the Joule heat $J_A$ resulting from an arc generated upon closing of the relay 31 at the start of dynamic braking used in integration processing by the integration unit 14 is obtained by reading out from the table stored in the storage unit 13, an amount of heat corresponding to each of the above-mentioned types of information and the value of dynamic braking current obtained by the dynamic braking current calculation unit 11 at the start of dynamic braking, every time dynamic braking is performed. The use of such a table allows more accurate prediction of the life of the relay 31 in the dynamic braking circuit 21 even when the motor driving device 1 is operated under a special environment such as high temperature, low temperature, high humidity, low humidity, high pressure, or low pressure.

In the above-described embodiment, the motor 2 serves as a three-phase AC motor. However, since each arithmetic expression used in processing for predicting the life of the relay 31 in the dynamic braking circuit 21 is defined based on the single-phase equivalent circuit described with reference to FIG. 2, three phases may not be taken into consideration for the following reason. A current flowing through the single-phase equivalent circuit illustrated as FIG. 2 is exactly identical to a current flowing through the contacts of one relay 31. In addition, in the dynamic braking circuit 21, since no relay is present for one of the three phases and no contact resistance for the relay is therefore generated for this phase, the contact currents of the relay 31 for the remaining two phases can be regarded as having the same amplitude, although having a phase difference. This makes it possible to accurately predict the lives of two relays 31 in the dynamic braking circuit 21 even when life prediction processing is performed on the basis of each of the above-mentioned arithmetic expressions based on a single-phase equivalent circuit.

The present invention achieves a compact, low-cost motor driving device capable of accurately predicting the life of a relay in a dynamic braking circuit.

As is generally known, every time a relay in a dynamic braking circuit is closed, an arc resulting from chattering generated between contacts gradually shortens the life of the relay. According to the present invention, however, the life of the relay is predicted in consideration of damage inflicted on the relay by the arc and therefore can be predicted more accurately. Further, the value of dynamic braking current flowing through the dynamic braking circuit used to predict the life of the relay is obtained not through detection by a current detection unit but through calculation by a dynamic braking current calculation unit. This involves no current detection unit for predicting the life of the relay in the dynamic braking circuit, thus downsizing the motor driving device at a low cost.

What is claimed is:

1. A motor driving device, comprising:
   a dynamic braking circuit configured to close a relay located across input terminals of a motor to cause a resistive short circuit across the input terminals to generate a deceleration torque in the motor; and
   electrical circuitry in electrical communication with the dynamic braking circuit, whereby, upon receipt of indication that the relay is closed, the electrical circuitry:
   calculates a value of a dynamic braking current flowing through the dynamic braking circuit, based on a motor rotational speed detected by a rotation sensor and a parameter predefined for the motor and the dynamic braking circuit, the value of the dynamic braking current being a first value during the dynamic braking period and a second value at the start of dynamic braking period;
   calculates a first Joule heat based on the first value of dynamic braking current;
   retrieves a second Joule heat from a table defining a relationship between the second value of dynamic braking current and the second Joule heat, the second Joule heat resulting from an arc generated in vicinity of the contact of the relay when the relay is closed;
   integrates a sum of the first Joule heat and the second Joule heat every time dynamic braking is performed to calculate an integration value; and
   compares the integration value with a preset reference value and outputs a comparison result;
   wherein, when the relay is closed, an arc is generated due to chattering between contacts of the relay; and
   wherein the electrical circuitry determines the life of the relay based on the calculated first Joule heat and the second Joule heat after the arc is generated.

2. The motor driving device according to claim 1, further comprising an alarm in electrical communication with the electrical circuitry, wherein the alarm alerts when the comparison result reveals that the integration value has exceeded the preset reference value.

3. The motor driving device according to claim 1, further comprising a display which displays the comparison result.

4. The motor driving device according to claim 1, wherein:
   the table defines a relationship between the second Joule heat and information representing at least one of a voltage across the input terminals, a humidity in vicinity of the motor, an atmospheric pressure in the vicinity of the motor, and a temperature in the vicinity of the motor at the start of dynamic braking; and
   the second Joule heat is obtained based on the information and the value of dynamic braking current at the start of dynamic braking every time dynamic braking is performed.

* * * * *